United States Patent
Lee et al.

(10) Patent No.: US 9,530,517 B2
(45) Date of Patent: Dec. 27, 2016

(54) READ DISTURB DETECTION IN OPEN BLOCKS

(71) Applicant: SanDisk Technologies Inc., Plano, TX (US)

(72) Inventors: Aaron Lee, Mountain View, CA (US); Zhenming Zhou, San Jose, CA (US); Mrinal Kochar, San Jose, CA (US); Cynthia Hua-Ling Hsu, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/717,582

(22) Filed: May 20, 2015

(65) Prior Publication Data

US 2016/0343449 A1 Nov. 24, 2016

(51) Int. Cl.
| | |
|---|---|
| *G11C 16/04* | (2006.01) |
| *G11C 16/34* | (2006.01) |
| *G11C 11/56* | (2006.01) |
| *G11C 16/16* | (2006.01) |
| *G11C 16/26* | (2006.01) |
| *G11C 16/10* | (2006.01) |
| *G11C 16/14* | (2006.01) |

(52) U.S. Cl.
CPC ....... *G11C 16/3431* (2013.01); *G11C 11/5635* (2013.01); *G11C 11/5642* (2013.01); *G11C 16/10* (2013.01); *G11C 16/14* (2013.01); *G11C 16/16* (2013.01); *G11C 16/26* (2013.01); *G11C 16/3418* (2013.01); *G11C 16/3427* (2013.01); *G11C 16/3445* (2013.01); *G11C 16/0483* (2013.01)

(58) Field of Classification Search
CPC . G11C 16/3418; G11C 16/0483; G11C 16/10; G11C 16/14; G11C 16/16
USPC .......................... 365/185.02, 185.29, 185.11
See application file for complete search history.

(56) References Cited

U.S. PATENT DOCUMENTS

| | | | |
|---|---|---|---|
| 7,697,359 B2 * | 4/2010 | Lee ..................... | G11C 16/3431 365/222 |
| 8,725,936 B2 * | 5/2014 | Oikawa ................. | G06F 11/004 711/103 |
| 9,019,773 B2 * | 4/2015 | Park .................... | G11C 16/3436 365/185.22 |
| 2014/0019675 A1 * | 1/2014 | Oh ....................... | G06F 12/0246 711/103 |

* cited by examiner

*Primary Examiner* — Pho M Luu
(74) *Attorney, Agent, or Firm* — Brinks Gilson & Lione (57) ABSTRACT

A storage device with a memory may include read disturb detection for open blocks. An open or partially programmed block may develop read disturb errors from reading of the programmed portion of the open block. The detection of any read disturb effects may be necessary for continued programming of the open block and may include verifying that wordlines in the unprogrammed portion of the open block are in the erase state. A modified erase verify operation for the open block is used in which programmed wordlines are subject to a higher erase verify read voltage, while the unprogrammed wordlines are subject to an erase verify bias voltage.

20 Claims, 9 Drawing Sheets

READ DISTURB DETECTION IN OPEN BLOCKS

TECHNICAL FIELD

This application relates generally to memory devices. More specifically, this application relates to a process for allowing read operations in open blocks by detecting read disturb for unprogrammed wordlines.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory may have read disturb (RD) errors caused when the programming of one cell modifies a neighboring cell. This may occur when one wordline is programmed and that programming voltage leaks to a neighboring wordline. Read disturb may be a problem when attempting to read from an open block.

DESCRIPTION OF THE EMBODIMENTS

Read scrub may be used to refresh the existing data to prevent a natural degradation of the data content. The natural degradation may be caused by reads being performed on the flash (i.e. read disturb), or by data sitting for a long time (i.e. data retention). To prevent this degradation, the system would like to detect which data is about to go bad, then read it, ECC correct it, and write it to a new location. Detection of before data goes bad is difficult because over-detection may result in excessive data movement. Upon detection, a read scrub is not part of the user operation, so an internal read scrub should avoid occupying user observed time by being in the background or during idle time. For a removable product, idle time may be sparse because users may remove the "removable" flash from the host, so power is not present.

A storage device with a memory may include read disturb (RD) detection when reading open blocks. Read disturb errors may be caused when cells in a memory block change over time (e.g. become programmed unintentionally). An open or partially programmed block that is read frequently may have read disturb errors of the unprogrammed cells/wordlines. The detection of any read disturb effects may be necessary before continuing to program an open block.

After every erase attempt, an erase verify operation is needed to determine whether all the cells have been successfully erased. If erase verify fails, another erase pulse is needed. A modified erase verify operation for the open block is used in which programmed wordlines are subject to a higher erase verify voltage (e.g. read voltage), while the unprogrammed wordlines are subject to the usual erase verify bias voltage. This modified erase verify operation can be used to detect any defects or read disturb errors from the unprogrammed wordlines. As a single operation, the modified erase verify operation does not result in a speed loss or require significant processing time/resources.

An open block is any block that has been partially programmed. The programming of the block was started, but not finished such that a portion of the wordlines are programmed, while the remaining wordlines are unprogrammed. Conversely, an erased block is a block that includes all unprogrammed wordlines and a closed block is a block that is programmed with valid data and without any open cells/wordlines. Read operations of the programmed wordline of an open block may disturb (read disturb) the unprogrammed wordlines. As block sizes increase, programming of an entire block may be more difficult, which requires more reads from open blocks. In other words, it may be more efficient to only partially program a block and access the partially programmed portion of the open block. Accordingly, the modified erase verify operation described below can be used to ensure data accuracy and reduce read disturb errors when reading open blocks.

Figure 1A:
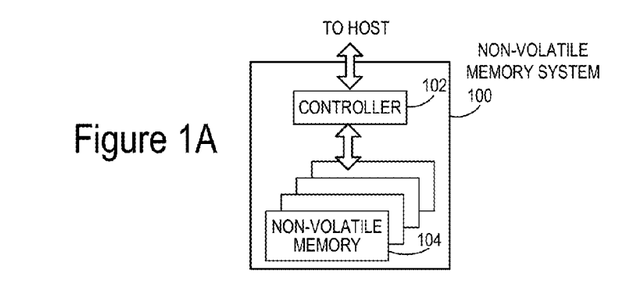
FIG. 1A is a block diagram of an example non-volatile memory system.

FIG. 1A is a block diagram illustrating a non-volatile memory system. The non-volatile memory system 100 includes a controller 102 and non-volatile memory that may be made up of one or more non-volatile memory die 104. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The non-volatile memory die 104 may store an operating system for the host.

Examples of host systems include, but are not limited to, personal computers (PCs), such as desktop or laptop and other portable computers, tablets, mobile devices, cellular telephones, smartphones, personal digital assistants (PDAs), gaming devices, digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

Although in the example illustrated in FIG. 1A, non-volatile memory system 100 includes a single channel between controller 102 and non-volatile memory die 104, the subject matter described herein is not limited to having a single memory channel. For example, in some NAND memory system architectures, such as in FIGS. 1B and 1C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
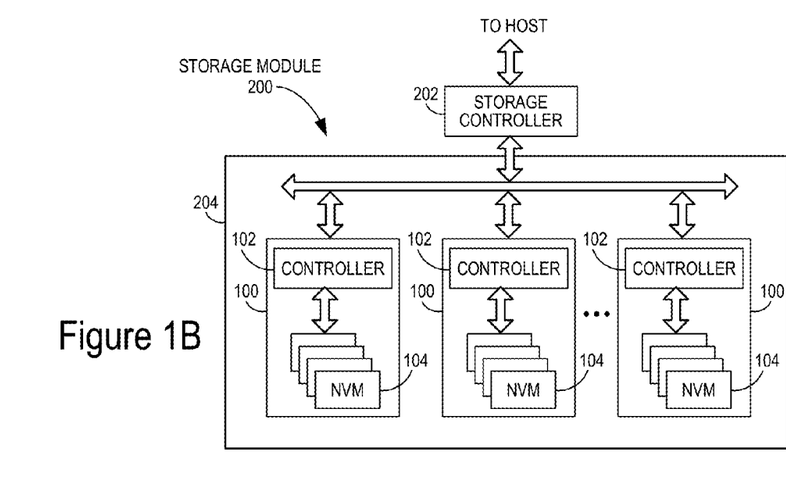
FIG. 1B is a block diagram of a storage module that includes a plurality of non-volatile memory systems.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
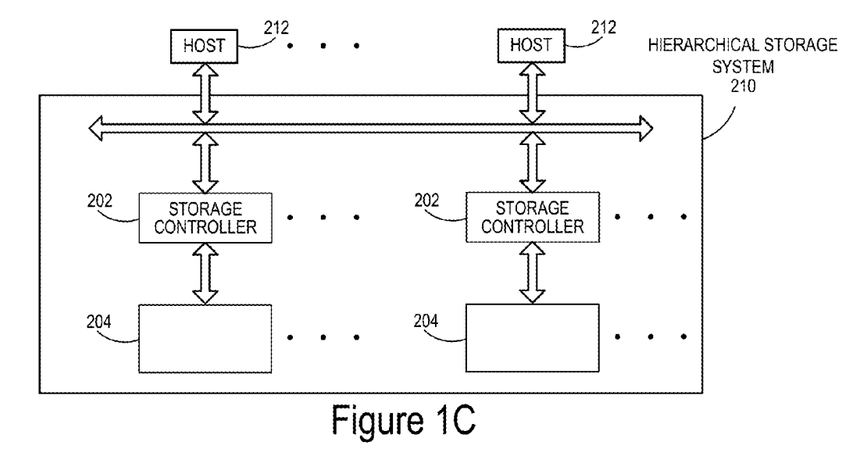
FIG. 1C is a block diagram of a hierarchical storage system.

FIG. 1C is a block diagram illustrating a hierarchical storage system. A hierarchical storage system 210 includes a plurality of storage controllers 202, each of which control a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
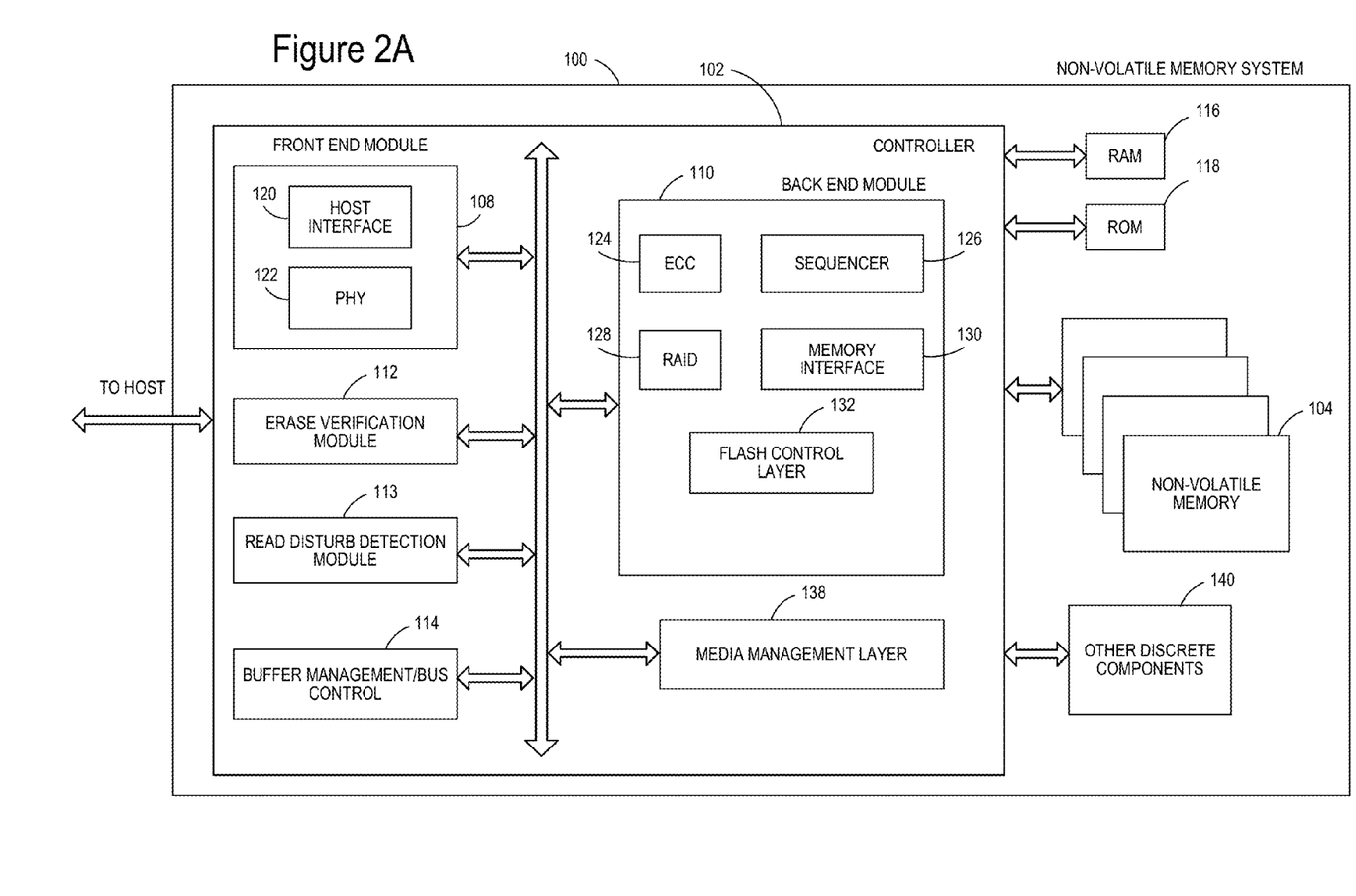
FIG. 2A is a block diagram of exemplary components of a controller of a non-volatile memory system.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of the memory 104, for example, that comprises instructions executable with a processor to implement one or more of the features of the module. When any one of the modules includes the portion of the memory that comprises instructions executable with the processor, the module may or may not include the processor. In some examples, each module may just be the portion of the memory 104 or other physical memory that comprises instructions executable with the processor to implement the features of the corresponding module.

Modules of the controller 102 may include an erase verification module 112 and/or a read disturb detection module 113 present on the die of the controller 102. As explained in more detail below in conjunction with FIGS. 7-8, the erase verification module 112 performs a modified version of an erase verify operation on an open block for determining when unprogrammed cells are properly erased. This erase modification may be used with the read disturb detection module 113, which utilizes the results from the modified erase verify operation to determine if there are any read disturb errors in the unprogrammed cells/wordlines of an open block. The operation of the erase verification module 112 and the read disturb detection module 113 are explained in more detail below in conjunction with FIG. 9. The erase modification algorithm may be in the firmware and executed by the controller.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

The FTL or MML 138 may be integrated as part of the flash management that may handle flash errors and interfacing with the host. In particular, MML may be a module in flash management and may be responsible for the internals of NAND management. In particular, the MML 138 may include an algorithm in the memory device firmware which translates writes from the host into writes to the flash memory 104. The MML 138 may be needed because: 1) the flash memory may have limited endurance; 2) the flash memory 104 may only be written in multiples of pages; and/or 3) the flash memory 104 may not be written unless it is erased as a block. The MML 138 understands these potential limitations of the flash memory 104 which may not be visible to the host. Accordingly, the MML 138 attempts to translate the writes from host into writes into the flash memory 104. As described below, erratic bits may be identified and recorded using the MML 138. This recording of erratic bits can be used for evaluating the health of blocks.

Figure 2B:
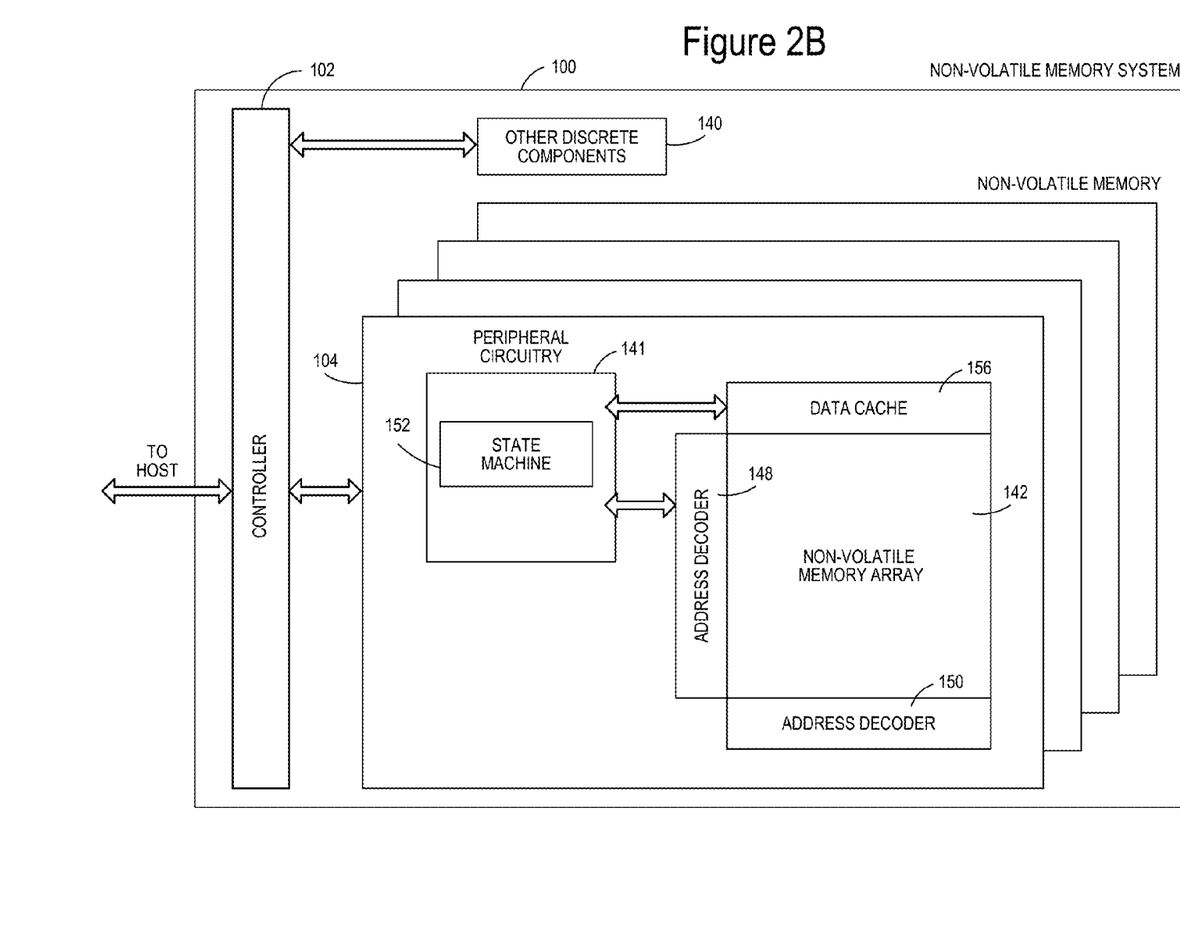
FIG. 2B is a block diagram of exemplary components of a non-volatile memory of a non-volatile memory storage system.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

Figure 3:
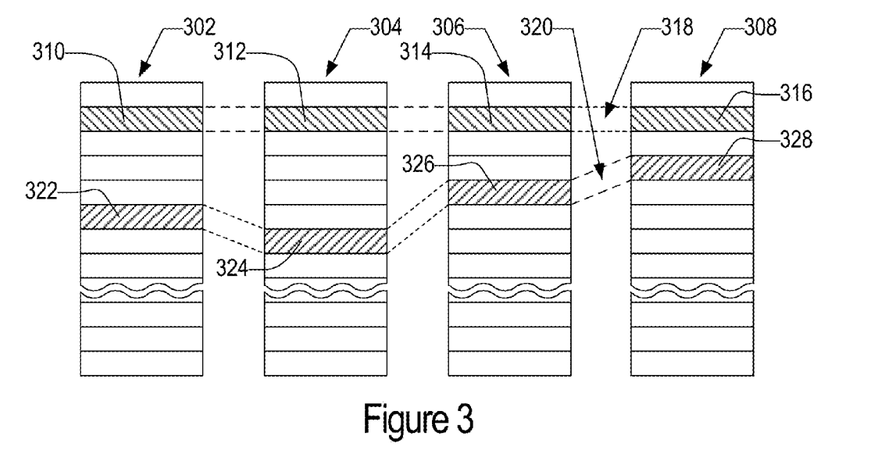
FIG. 3 is an example physical memory organization of the system of FIGS. 1A-2B.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below, the sentinel blocks may be an individual block or a combination of blocks, including one or more metablocks.

Figure 4:
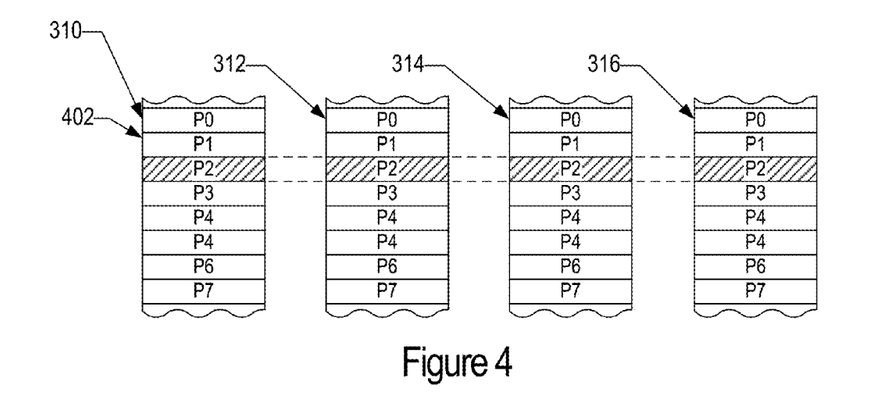
FIG. 4 is an expanded view of a portion of the physical memory of FIG. 3.

The individual blocks are in turn divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 4, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

As described, an open block is any memory group that is partially programmed. The reference to a block is merely exemplary and an open block may include sizes other than a block. Specifically, references to a block are merely one example of a size of a group of memory, but are utilized throughout this specification for simplicity. In other words, the embodiments including the modified erase verify operation and read disturb detection are not limited to the block size and the reference to an open block may include sizes that are smaller or larger than the block size. For example, an open block may be any of the metablocks described with respect to FIGS. 3-4 or may be smaller than the block size, such as the page size. An open block is a group of memory that is partially programmed.

Figure 5:
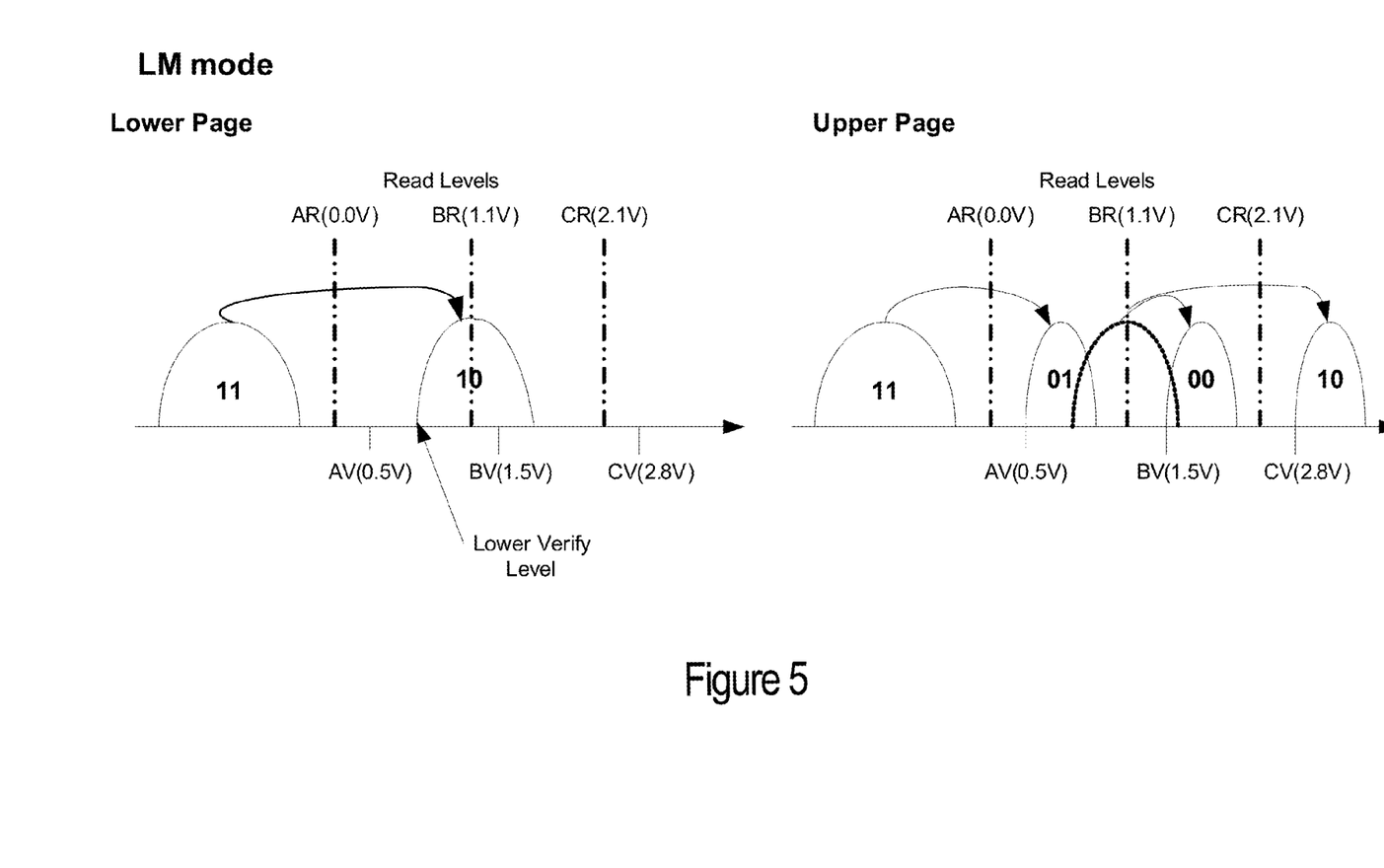
FIG. 5 is a diagram illustrating charge levels in a multi-level cell memory operated to store two bits of data in a memory cell.
Figure 6:
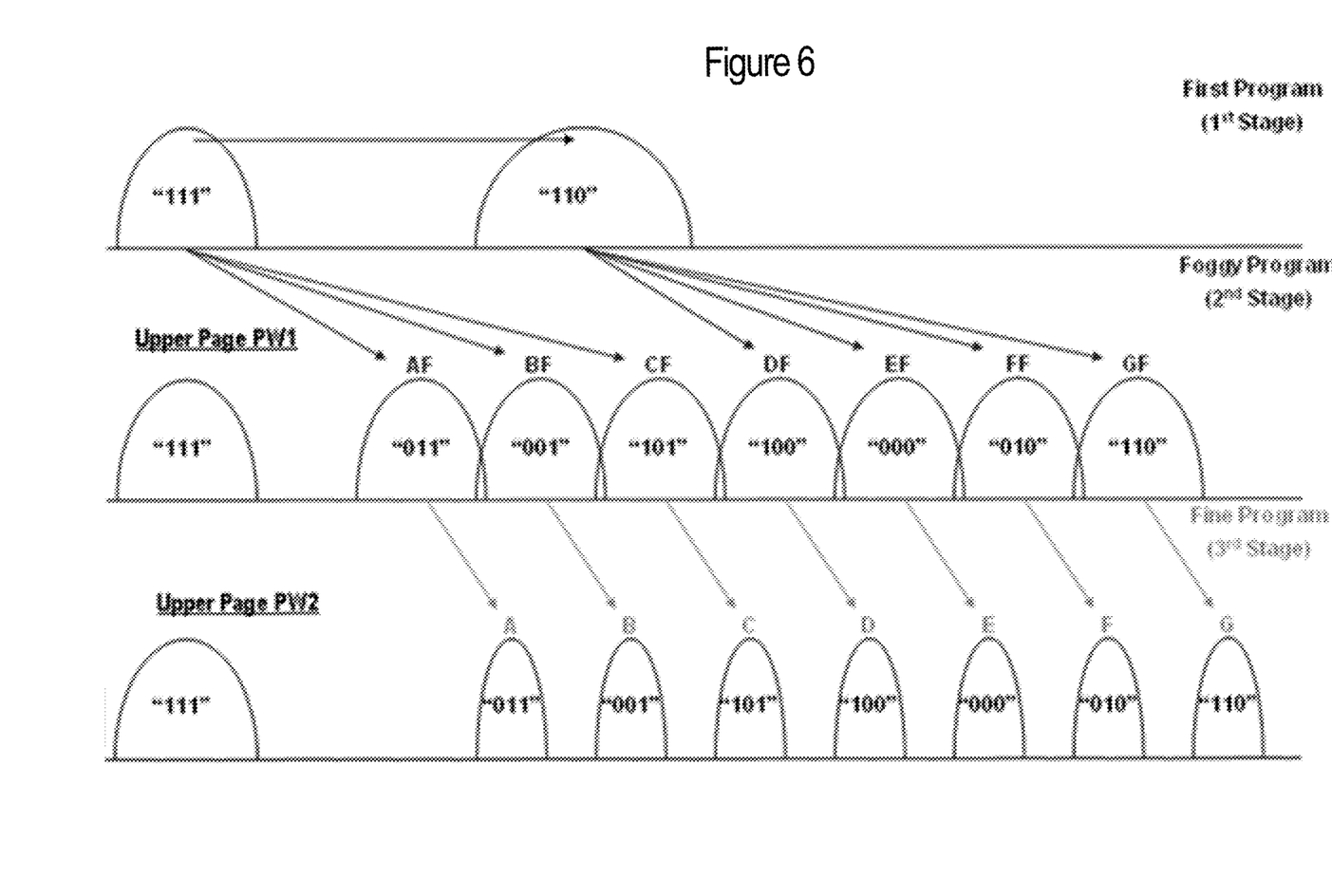
FIG. 6 is a diagram illustrating charge levels in a multi-level cell memory operated to store three bits of data in a memory cell.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Alternatively, MLC memory may store eight states for retaining three bits of data. FIG. 5 illustrates MLC memory with two bits of data (four states) and FIG. 6 illustrates MLC memory with three bits of data (eight states). The charge storage elements of the memory cells are most commonly conductive floating gates but may alternatively be non-conductive dielectric charge trapping material.

FIG. 5 illustrates one implementation of the four charge levels used to represent two bits of data in a memory cell. In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

FIG. 5 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

FIG. 6 is a diagram illustrating charge levels in a multi-level cell memory operated to store three bits of data in a memory cell. FIG. 6 illustrates MLC memory with three bits of data which are stored in a single cell by establishing eight states or voltage level distinctions. This memory may be referred to as X3 memory. FIG. 6 illustrates the stages that may be used for programming three bit memory. In a first stage, the voltage levels are divided out at two levels, and at the second stage (i.e. foggy program), those two levels are divided up into the eight states without setting the distinct levels between states. At the third stage (i.e. fine program), the voltage levels for each of the eight states are separated and distinct. The fine programming establishes the voltage levels for each of the states. As compared with two bit memory, the three bit memory in FIG. 6 requires more exact programming voltages to avoid errors.

Electron movement or loss from the charge values may result in problems (e.g. data retention problems or read disturb errors). Read disturb (RD) errors may be caused when cells in a memory block change over time (e.g. become programmed unintentionally). It may be due to a particular cell being excessively read which may cause the read disturb error for neighboring cells. In particular, a cell that is not being read, but receives elevated voltage stress because a neighboring cell is being read. Charge may collect on floating gates, which may cause a cell to appear to be programmed. Read disturb may move the read voltage to higher values. The read disturb error may result in a data loss. ECC may correct the error and an erase cycle can reset the programming of the cell.

Specifically, read disturb may include an inadvertent transition from the erase state to the next state (sometimes referred to as the A state). For example, in FIG. 5, this would be a transition from 11 to 01, or in FIG. 6, this would be a transition from 111 to 011. This inadvertent transition may be caused by voltage applied to neighboring wordlines/cells that cause the erased state (e.g. 111) to have enough charge to pass the next voltage level and into a different state (e.g. 011). Frequent read operations to the programmed wordlines/cells may result in this inadvertent transition from the erase state.

The modified erase verify operation and read disturb detection may be useful for any type of memory (including 2 bit per cell and 3 bit per cell memory). However, this detection may be most useful for MLC memory with a higher bit per cell. For example, with the finer voltage levels of 3 bit per cell memory (shown in FIG. 6), there is an increased likelihood of leakage and/or read disturb errors. Accordingly, open block reading in three bit per cell MLC memory is more likely to result in errors than open block reading in 2 bit per cell memory.

Figure 7:
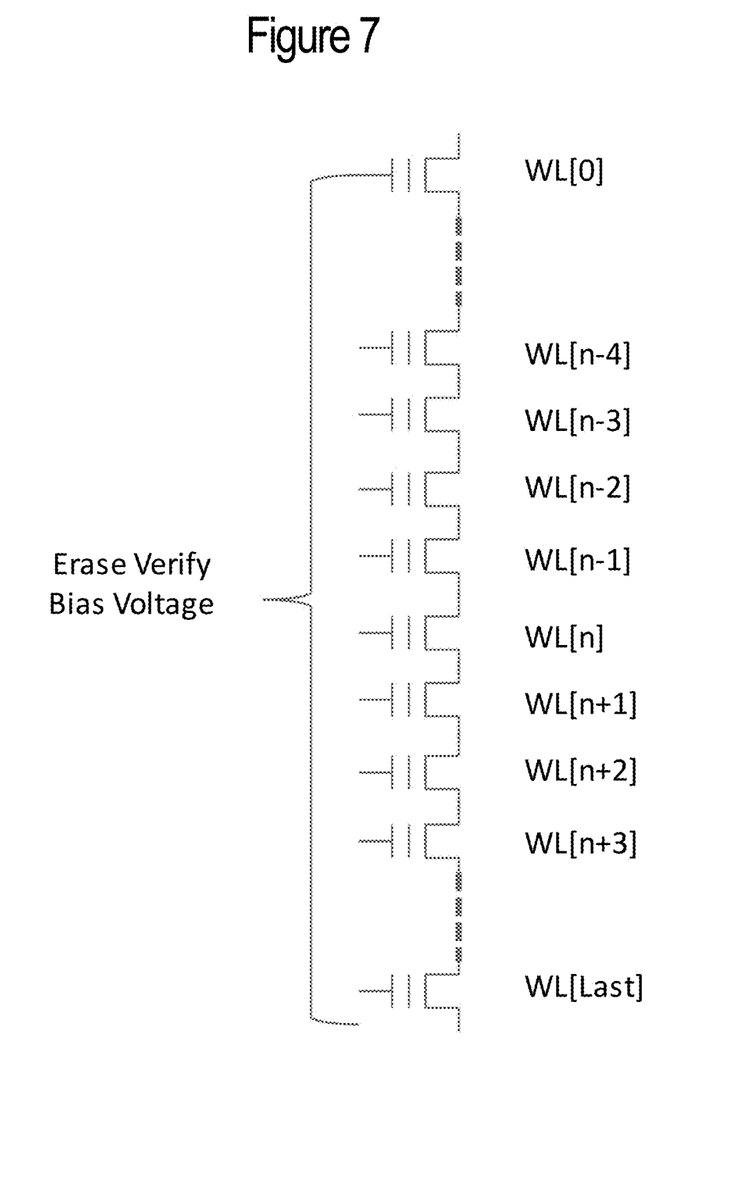
FIG. 7 is a diagram of an erase verify operation on wordlines using a bias voltage.

FIG. 7 is a diagram of an erase verify operation on wordlines using a bias voltage. After every erase attempt, an erase verify operation may be used to determine whether all the cells have been successfully erased. In particular, an erase verify operation confirms that unprogrammed/erased wordlines are in fact unprogrammed or in the erase state. The erase verify operation may provide an indication of how many bits or cells are in the erase state. As mentioned, frequent read operations of an open block may result in a high bit error rate or even data corruption that is at least partially due to read disturb.

The erase verify operation is applied to all wordlines at substantially the same time as a single voltage pulse that is applied across all the wordlines. If the erase verify operation fails, another erase pulse may be needed. The erase pulse may be low voltage level that is applied (e.g. −2 Volts) to set the cells to the erase state. After an erase operation is performed on a typical NAND string, an erase verify operation is performed by turning on the string-select and ground-select transistors, applying a non-negative erase verify voltage to each control gate of memory transistors between two select transistors, applying a bias voltage to the source of the ground-select transistor, and determining if any current flows through the NAND string. The erase verify voltage minus the bias voltage, which is the voltage drop across the gate and source (Vgs), should be slightly greater than the erased threshold voltage of the worst case transistor to ensure proper erase verification. FIG. 7 illustrates wordlines of a block. In an erase verify operation, the erase verify bias voltage is applied to every wordline in the block.

Figure 8:
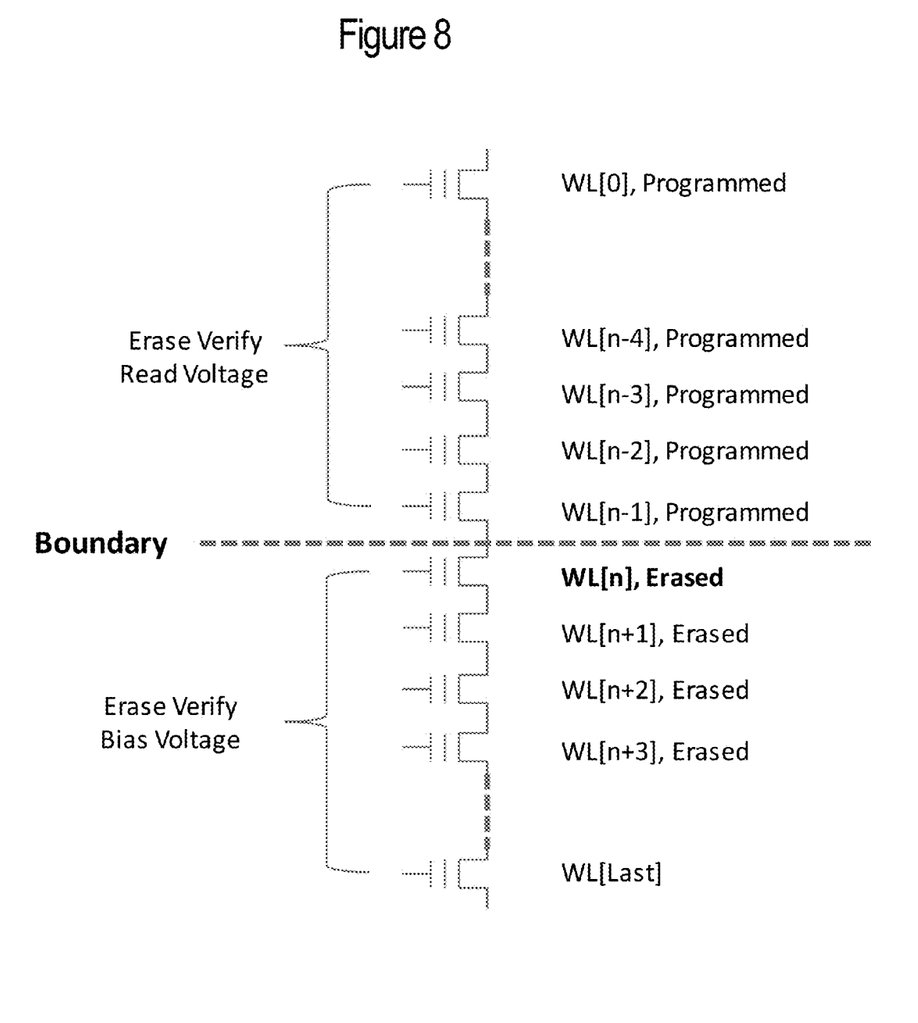
FIG. 8 is a diagram of a modified erase verify operation that uses a different voltages for programmed wordlines.

FIG. 8 is a diagram of a modified erase verify operation that uses a different voltages for programmed wordlines. This modified erase verify operation may also be referred to as a partial erase verify operation or a partial erase verify. An open block includes programmed and unprogrammed wordlines. The boundary illustrates where the programmed wordlines are separated from the unprogrammed (erased) wordlines. In this case, the boundary is at WL[n] where the nth wordline is the first unprogrammed/erased wordline. All wordlines before WL[n] are programmed (wordlines 0 through n−1) and all wordlines from n through the last wordline are unprogrammed or erased. The wordline WL[n] may be referred to as the first open wordline and may be used to identify the boundary because the memory controller (e.g. mapping) knows how many wordlines of the open block have already been programmed. Identification of the boundary can be performed on an open block because the last programmed wordline for the open block is known. Future programming of the open block would be occurring at wordline n. Accordingly, the modified erase verify operation utilizes the boundary.

The modified erase verify operation utilizes a different voltage level for the programmed wordlines than the voltage level that is used for the unprogrammed/erased wordlines. As shown in FIG. 7, an erase verify bias voltage (e.g. −2 Volts) is applied. In FIG. 8, this erase verify bias voltage is only applied to the unprogrammed/erased wordlines. Conversely, an erase verify read voltage is applied to the programmed wordlines (wordlines 0 through n−1). In one embodiment, the erase verify read voltage is just the read voltage level, which is a higher voltage, such as 7 Volts. The erase verify read voltage can be any voltage level that does not change the programmed value.

The modified erase verify operation shown in FIG. 8 may be a single operation that substantially simultaneously applies the two different voltages (to different wordlines). The erase verify voltages could be applied to individual wordlines, but that operation may be slower than applying that voltage to multiple wordlines, or to all of the wordlines. In other words, all wordlines may be verified at the same time rather than one-by-one. Further, since the traditional erase verify operation (e.g. FIG. 7) is applied to all of the wordlines of a block simultaneously, there are fewer memory changes that need to be implemented to utilize the modified erase verify operation (FIG. 8) on all the wordlines of a block. As described, the differences include identifying the boundary between programmed and unprogrammed, and then applying two different voltage levels for the modified erase verify operation.

In one embodiment, the modified erase verify operation may be performed on an open block before the open block is programmed again. In other words, before continuing or finishing the programming of an open block, the modified erase verify operation can confirm that the unprogrammed/erased wordlines in the open block are in fact unprogrammed and in the erased state. The modified erase verify operation can provide a real-time detection of any issues with the unprogrammed wordlines. Conversely, a hot count or counter method which counts reads is an attempt to predict problems, whereas the modified erase verify operation reveals any problems in real-time.

Figure 9:
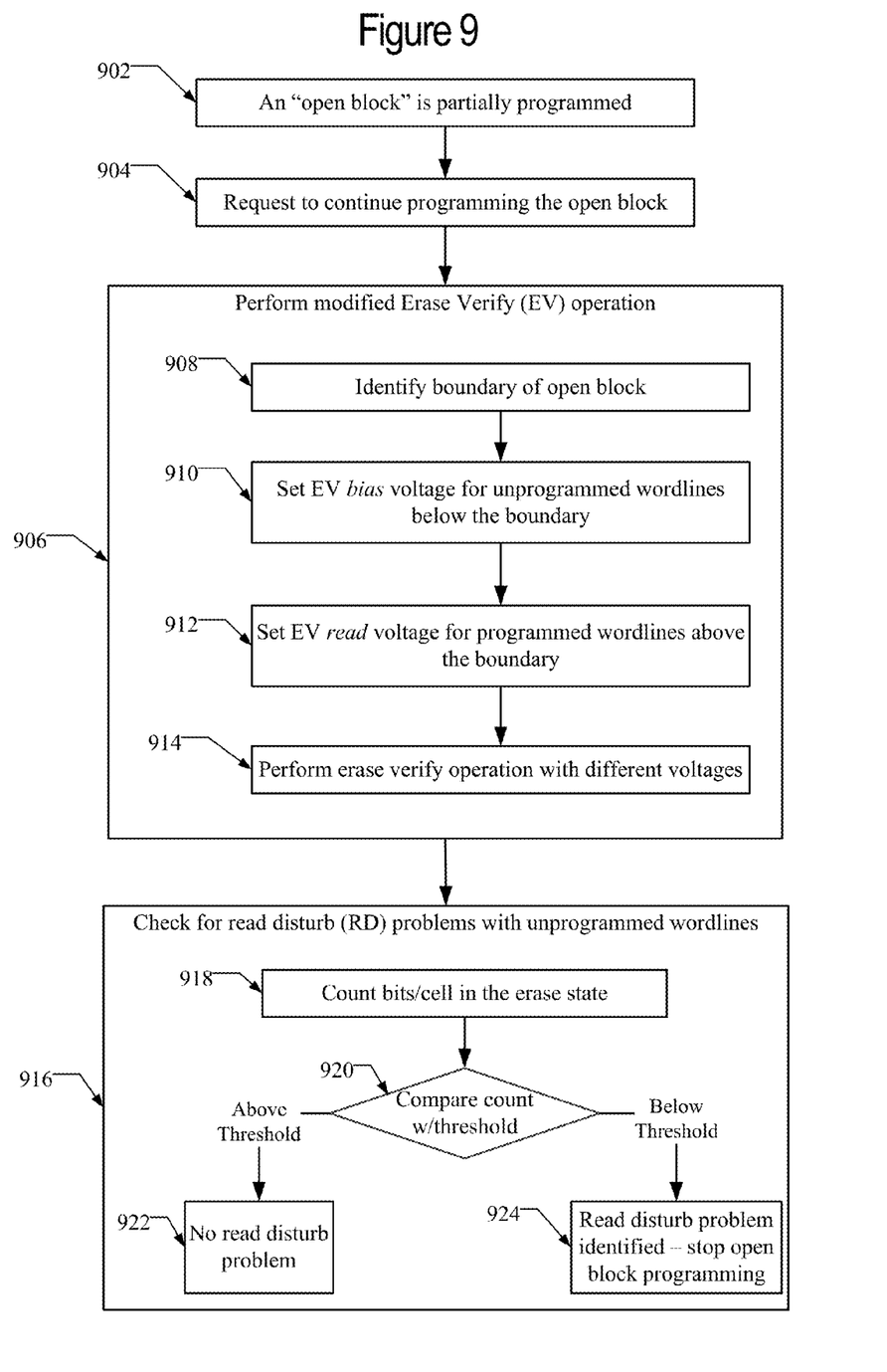
FIG. 9 is a flowchart describing read disturb detection in an open block using the modified erase verify operation.

FIG. 9 is a flowchart describing read disturb detection in an open block using the modified erase verify operation. In block 902, a block is partially programmed (i.e. an "open block"). The open block includes wordlines and cells that are programmed and includes wordlines and cells that are not programmed or in the erase state. In block 904, there may be a programming request to continue programming in the open block. The open block includes unprogrammed/erased wordlines that can still be programmed, however, due to read disturb concerns, the modified erase verify operation 906 may be performed before continuing to program the open block. The modified erase verify operation 906 is further described with respect to FIG. 8 and may include identifying the boundary 908 of the open block as shown in FIG. 8. The erase verify bias voltage is set 910 of the unprogrammed wordlines which are below the boundary (as shown in FIG. 8) and the erase verify read voltage is set 912 for the programmed wordlines which are above the boundary (as shown in FIG. 8). The erase verify operation with the two voltage levels (bias voltage for unprogrammed wordlines and read voltage for programmed wordlines) is performed 914. This erase verify operation can be performed on all wordlines together so that it does not slow down the memory.

The modified erase verify operation 906 can be used for checking for any read disturb problems with the unprogrammed wordlines 916. Using the modified erase verify operation, the bits or cells in the erase state can be counted 918. The bits in the erase state are compared with a threshold 920. When the count of the bits in the erase state are above the required threshold, there is no read disturb problem 922 and the open block can continue to be programmed by the request in block 904. When the count of the bits in the erase state are below the required threshold, then it is indicative that the unprogrammed wordlines are not in the erase state, and a read disturb problem is identified 924. In block 924, the request to continue programming the open block (904) is denied because the unprogrammed wordlines cannot be properly programmed. If any wordlines fail the erase verify operation, then the block may be considered to have failed and the data may need to be transferred to another block. The programmed data in the open block may be transferred to another block or may remain in the open block, but the unprogrammed wordlines of that open block will not be programmed because of the detected problems. The threshold value may be varied and may depend on the type, usage, or age of the memory. For example, older memory may have a higher threshold because it may be more prone to errors. Other empirical data may be used for determining the threshold. In one embodiment, since the behavior of one generation of memory may be more or less similar, the threshold may be determined by initial characterization of each memory generation.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory. In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents that are intended to define the scope of the claimed invention. Finally, it should be noted that any aspect of any of the preferred embodiments described herein can be used alone or in combination with one another.

We claim:

1. A method for programming a block comprising:
    programming the block such that some wordlines are programmed and some wordlines are not programmed;
    receiving a request to continue programming of the wordlines that are not programmed; and
    performing a block level erase verify operation on all of the wordlines, wherein the erase verify operation biases the programmed wordlines differently from the not programmed wordlines.

2. The method of claim 1 wherein the block level erase verify operation is performed for the block and not performed wordline by wordline.

3. The method of claim 1 wherein the block comprises an open block until all wordlines in the block are programmed.

4. The method of claim 1 wherein the programmed wordlines are biased at a higher voltage.

5. The method of claim 4 wherein the higher voltage is a read voltage.

6. The method of claim 1 wherein the not programmed wordlines are biased at an erase voltage.

7. The method of claim 6 wherein the erase voltage is a negative voltage level.

8. The method of claim 1 further comprising:
    counting, from the erase verify operation, a number of cells from the non-programmed wordlines that are not in an erase state; and
    determining whether the counted number of cells exceeds a threshold.

9. The method of claim 8 further comprising:
    continuing, in response to the request, the programming of the block when the counted number of cells is less than the threshold.

10. The method of claim 8 further comprising:
    preventing further programming of the block when the counted number of cells exceeds the threshold by declining the request to continue programming.

11. The method of claim 1 wherein the method is performed with flash memory and the flash memory comprises a three-dimensional (3D) memory configuration, and wherein a controller is associated with operation of and storing to the flash memory.

12. A storage device comprising:
    a non-volatile memory with blocks of memory, wherein at least one of the blocks is a partially programmed block;
    an erase verification module that performs an erase verification operation on the partially programmed block with two different voltage levels depending on whether a wordline in the partially programmed block is programmed or not programmed; and a read disturb detection module that prevents continued programming of the partially programmed block when the erase verification operation fails.

13. The storage device of claim 12 wherein the erase verification operation includes a read voltage applied to programmed wordlines of the partially programmed block and an erase verification voltage applied to non-programmed wordlines of the partially programmed block.

14. The storage device of claim 13 wherein the erase verification operation fails when a number of cells from the non-programmed wordlines of the partially programmed block that are not in an erase state exceeds a threshold.

15. The storage device of claim 14 wherein read operations for programmed wordlines of the partially programmed block cause a read disturb of non-programmed wordlines of the partially programmed block.

16. The storage device of claim 12 wherein the nonvolatile memory is three bit per cell memory.

17. A method for detecting read disturb in a block comprising:

partially programming the block;

performing, prior to continuing programming of the partially programmed block, a modified erase verify operation on the block that determines a number of unprogrammed cells of the block that are not in an erase state; and determining the read disturb of the block is excessive when the number of the unprogrammed cells of the block that are not in an erase state exceeds a threshold.

18. The method of claim 17 wherein the modified erase verify operation comprises biasing programmed wordlines from the block at a high voltage and biasing non-programmed wordlines from the block at a low voltage.

19. The method of claim 18 wherein the low voltage comprises an erase voltage level and the high voltage comprises a read voltage level.

20. The method of claim 17 wherein the threshold depends on a type of memory of the block or an intended usage of the block.

* * * * *